US005703380A

United States Patent [19]

Potter

[11] Patent Number: 5,703,380

[45] Date of Patent: Dec. 30, 1997

[54] LAMINAR COMPOSITE LATERAL FIELD-EMISSION CATHODE

[75] Inventor: Michael D. Potter, Grand Isle, Vt.

[73] Assignee: Advanced Vision Technologies Inc., Rochester, N.Y.

[21] Appl. No.: 490,061

[22] Filed: Jun. 13, 1995

[51] Int. Cl.$^6$ ............ H01L 29/06; H01J 1/46

[52] U.S. Cl. ............ 257/10; 257/77; 313/306; 313/351

[58] Field of Search ............ 257/10, 77; 313/306, 313/307, 309, 311, 336, 351; 445/50, 51; 156/630.1, 634.1, 652.1, 656.1

[56] References Cited

U.S. PATENT DOCUMENTS

| | | | |
|---|---|---|---|
| 3,699,404 | 10/1972 | Simon et al. | 317/235 R |
| 3,806,372 | 4/1974 | Sommer | 148/1.5 |
| 4,164,680 | 8/1979 | Villalobos | 313/336 |
| 4,307,507 | 12/1981 | Gray et al. | 29/580 |
| 4,513,308 | 4/1985 | Greene et al. | 313/351 |
| 4,728,851 | 3/1988 | Lambe | 313/309 |
| 4,827,177 | 5/1989 | Lee et al. | 313/306 |
| 4,964,946 | 10/1990 | Gray et al. | 156/643 |
| 5,089,292 | 2/1992 | McCaulay et al. | 427/78 |
| 5,129,850 | 7/1992 | Kane et al. | 445/24 |
| 5,138,237 | 8/1992 | Kane et al. | 315/349 |
| 5,141,460 | 8/1992 | Jaskie et al. | 445/24 |
| 5,144,191 | 9/1992 | Jones et al. | 313/308 |
| 5,170,100 | 12/1992 | Shichao et al. | 315/366 |
| 5,180,951 | 1/1993 | Dworsky et al. | 315/169.3 |
| 5,199,918 | 4/1993 | Kumar | 445/50 |
| 5,201,992 | 4/1993 | Marcus et al. | 156/643 |
| 5,202,571 | 4/1993 | Hirabayashi | 257/10 |
| 5,214,347 | 5/1993 | Gray | 313/355 |
| 5,233,263 | 8/1993 | Cronin et al. | 313/309 |
| 5,252,833 | 10/1993 | Kane et al. | 250/423 F |
| 5,256,888 | 10/1993 | Kane | 257/77 |
| 5,258,685 | 11/1993 | Jaskie et al. | 313/309 |
| 5,266,155 | 11/1993 | Gray | 156/651 |
| 5,278,475 | 1/1994 | Jaskie et al. | 315/169.3 |
| 5,280,221 | 1/1994 | Okamoto et al. | 315/169.1 |
| 5,283,501 | 2/1994 | Zhu et al. | 315/169.3 |
| 5,289,086 | 2/1994 | Kane | 315/349 |
| 5,290,610 | 3/1994 | Kane et al. | 427/577 |
| 5,308,439 | 5/1994 | Cronin et al. | 156/656 |
| 5,315,126 | 5/1994 | Field | 257/10 |

(List continued on next page.)

OTHER PUBLICATIONS

Geis et al. "Diamond Cold Cathode" IEEE Electron Device Letters, vol. 12, No. 8, Aug. 1991, pp. 456–459.

Djubua et al. "Emission Properties of Spindt–Type Cold Cathodes with Different Emission Cone Material" IEEE Trans. Electron Devices, vol. 38, No. 10, Oct. 1991, pp. 2314–2316.

*Primary Examiner*—Mark V. Prenty

*Attorney, Agent, or Firm*—Theodore R. Touw

[57] ABSTRACT

A lateral-emitter electron field emission device structure incorporates a thin film laminar composite emitter structure including two or more films composed of materials having different etch rates when etched by an etchant. In its simplest form, the laminar composite emitter consists of two ultra-thin layers, etched differentially so that a salient remaining portion of the more etch-resistant layer protrudes beyond the less etch-resistant layer to form a small-radius tip. In a preferred form of the laminar composite emitter, it is a multi-layer laminar emitter, of which the most etch-resistant layer is doped-diamond. The diamond layer is doped using one or more N-type dopants. In this preferred emitter structure, the edge of the thin film diamond layer is the dominant electron emitter with a very low (nearly zero) work function. Hence the new device can operate at applied voltages substantially lower than in prior art. The laminar structure may be a sandwich structure with three layers. Upper and/or lower supporting metallic layers act as both physical supporting material and as an integral electrical conducting medium. This allows the diamond layer to be very thin, on the order of tens of angstroms (i.e. less than 100 angstroms). The laminar composite emitter is specially adapted to fabrication by a method using semiconductor integrated circuit fabrication processes.

41 Claims, 6 Drawing Sheets

U.S. PATENT DOCUMENTS

| | | | |
|---|---|---|---|
| 5,334,908 | 8/1994 | Zimmerman | 313/336 |
| 5,341,063 | 8/1994 | Kumar | 313/309 |
| 5,349,265 | 9/1994 | Lemelson | 313/345 |
| 5,354,694 | 10/1994 | Field et al. | 437/3 |
| 5,386,172 | 1/1995 | Komatsu | 313/309 |
| 5,397,957 | 3/1995 | Zimmerman | 313/309 |
| 5,409,568 | 4/1995 | Vasché | 156/657 |
| 5,548,185 | 8/1996 | Kumar et al. | 313/495 |
| 5,552,613 | 9/1996 | Mishibayashi et al. | 257/10 |

S9

S10

S11

S12

S13

S14

S15

S16

S17

S18

S19

S20

LAMINAR COMPOSITE LATERAL FIELD-EMISSION CATHODE

This application is related to copending application Ser. No. 08/489,722 filed on Jun. 13, 1995. The invention of this application is described in Disclosure Document No. 374961, received by the United States Patent and Trademark Office on Apr. 25, 1995.

FIELD OF THE INVENTION

This invention relates in general to integrated field-emission microelectronic devices and relates more particularly to such devices having a field emission cathode with a laminar composite lateral emitter structure and to methods of fabricating such devices.

BACKGROUND OF THE INVENTION

A review article on the general subject of vacuum microelectronics was published in 1992: Heinz H. Busta "Vacuum Microelectronics - 1992," "Journal of Micromechanics and Microengineering," Vol. 2, No. 2 (June 1992). An article by Katherine Derbyshire, "Beyond AMLCDs: Field Emission Displays?" Solid State Technology, Vol. 37 No. 11 (November 1994) pages 55–65, summarized fabrication methods and principles of operation of some of the competing designs for field emission devices and discussed some applications of field emission devices to flat-panel displays. The theory of cold field emission of electrons is discussed in many textbooks and monographs, including the monograph by Robert Gomer, "Field Emission and Field Ionization" (Harvard University Press, Cambridge, Mass., 1961), Chapter 1. Field emission displays are considered an attractive alternative and replacement for liquid crystal displays, because of their lower manufacturing cost and lower complexity, lower power consumption, higher brightness, and improved range of viewing angles.

NOTATIONS AND NOMENCLATURE

Diamond is used in this specification to mean carbon, whether polycrystalline or monocrystalline (single crystal), having the diamond crystal structure wherein each carbon atom is bonded to four carbon atoms. The terms emitter and cathode are used interchangeably throughout this specification to mean a field emission cathode. The term "control electrode" is used herein to denote an electrode that is analogous in function to the control grid in a vacuum-tube triode. Such electrodes have also been called "gates" in the field emission device related art literature. Ohmic contact is used herein to denote an electrical contact that is non-rectifying. Phosphor is used in this specification to mean a material characterized by cathodoluminescence. In descriptions of phosphors, a conventional notation is used wherein the chemical formula for a host or matrix compound is given first, followed by a colon and the formula for an activator and/or co-activators (an impurity that activates the host crystal to luminesce), as in ZnS:Mn, where zinc sulfide is the host and manganese is the activator.

DESCRIPTION OF THE RELATED ART

Microelectronic devices using field emission of electrons from cold-cathode emitters have been developed for various purposes to exploit their many advantages including high-speed switching, insensitivity to temperature variations and radiation, low power consumption, etc. Most of the microelectronic field emission devices in the related art have had emitters which point orthogonally to the substrate, generally away from the substrate, but sometimes toward the substrate. Examples of this type of device are shown, for example, in U.S. Pat. No. 3,789,471 to Spindt et al., U.S. Pat. No. 4,721,885 to Brodie, U.S. Pat. No. 5,127,990 to Pribat et al., U.S. Pat. Nos. 5,141,459 and 5,203,731 to Zimmerman, U.S. Pat. No. 5,278,475 to Jaskie et al., U.S. Pat. No. 5,283,501 to Zhu et al., U.S. Pat. No. 5,290,610 to Kane et al., U.S. Pat. No. 5,341,063 to Kumar, and in the above-mentioned article by Derbyshire. In such structures, the anode is typically a transparent faceplate parallel to the substrate and carrying a phosphor which produces the display's light output by cathodoluminescence. A few cold-cathode microelectronic devices have had field emitters oriented in a plane substantially parallel to their substrates, as for example in U.S. Pat. No. 4,728,851 to Lambe, U.S. Pat. No. 4,827,177 to Lee et al., U.S. Pat. No. 5,289,086 to Kane, and U.S. Pat. Nos. 5,233,263 and 5,308,439 to Cronin et al. The terminology "lateral field emission" and "lateral cathode" of the latter two patents to Cronin et al. will be adopted herein to refer to a structure in which the field emitter edge or tip points in a lateral direction, i.e. substantially parallel to the substrate. Some device structures and fabrication processes using lateral cathode configurations have been found to have distinct advantages, such as extremely fine cathode edges or tips and precise control of the inter-element dimensions, alignments, capacitances, and required bias voltages. With the exception of the device of Kane's U.S. Pat. No. 5,289,086 mentioned above, the prior art lateral emitter field emission devices have had metallic emitters. The prior art lateral emitter field emission devices have had single-component emitters with substantially uniform material composition. Since some of the early experiments in field emission, methods of producing sharp cold-cathode tips have included chemical etching and/or electropolishing of single-component emitter materials.

It is known in the art that cold cathodes may be advantageously made with a diamond emitting surface having a low work function or negative electron affinity. Cold cathodes of diamond have been discussed by Geis et al. in IEEE Electron Device Letters, Vol. 12, No. 8, August 1991, pp. 456–459 and in "Applications of Diamond Films and Related Materials," Tzeng et al. (Editors), Elsevier Science Publishers B. V., 1991, pp. 309–310. U.S. Pat. No. 4,164,680 to Villalobos discloses a polycrystalline diamond emitter. U.S. Pat. No. 5,129,850 to Kane et al. discloses a method of making a molded field emission electron emitter employing a diamond coating. U.S. Pat. No. 5,138,237 to Kane et al. discloses a field emission electron device employing a modulatable diamond semiconductor emitter controlled by modulation of a junction depletion region. In U.S. Pat. No. 5,141,460 and in U.S. Pat. No. 5,258,685, both to Jaskie et al., a field emission electron source employing a diamond coating is disclosed, wherein carbon ions are implanted at a surface to function as nucleation sites for the diamond formation. A conductive layer is deposited over the diamond, and the substrate is removed to leave an electron emitter with a diamond coating. In U.S. Pat. No. 5,278,475 to Jaskie et al., a cathodoluminescent display apparatus is disclosed employing an electron source including a plurality of diamond crystallites. In U.S. Pat. No. 5,283,501 to Zhu et al., electron devices are disclosed employing electron sources including a material having a surface exhibiting a very low/negative electron affinity, such as, for example, the (111) crystallographic plane of type II-B diamond. In U.S. Pat. No. 5,289,086 to Kane, an electron device is disclosed employing a diamond material electron emitter and an anode, both disposed on a supporting substrate so as to define an interelectrode region therebetween. U.S. Pat. No. 5,290,610 to Kane et al., discloses a method for forming a diamond material layer on an electron emitter using hydrocarbon reactant gases ionized by emitting electrons. U.S. Pat. No. 5,341,063 to Kumar discloses a field emitter comprising a conductive metal and a diamond emission tip with negative electron affinity in ohmic contact with and protruding above the metal. U.S. Pat. No. 5,199,918 to Kumar discloses a method of fabricating a device of the latter type.

OBJECTS AND ADVANTAGES OF THE INVENTION

One object of the present invention is an improved lateral-emitter field-emission microelectronic device with a novel thin-film emitter capable of emitting electrons from a diamond surface having a low (nearly zero) work-function for electron emission. Another object is a microelectronic field emission device which combines all the advantages of lateral emitter construction with the advantages of a laminar composite emitter. A related object is a microelectronic field emission device which has both a low work function for electron emission and an extremely small emitter radius of curvature. Another object is a laminar composite lateral emission cathode operable with low applied voltages. A more specific related object is a laminar composite lateral emission cathode which takes advantage of the etch resistance of diamond to specific etch processes and also takes advantage of the low work function of diamond. A related object is a microelectronic field emission device which can have a very small gap between emitter and anode, thus allowing higher density in integrated device applications such as arrays. An overall object of the invention is an improved microelectronic device which nevertheless retains all the known advantages of lateral-emitter field emission devices, including the following: extremely fine cathode edges or tips; exact control of the cathode-to-anode distance (to reduce device operating voltage and to reduce device-to-device variability); exact control of the cathode-to-control-electrode distance (to control the control-electrode-to-cathode overlap, and thereby control the inter-electrode capacitances and more precisely control the required bias voltage); inherent alignment of the control-electrode and cathode structures; self-alignment of the anode structure to the control-electrode and cathode; and improved layout density. Another object of the invention in retaining known advantages of lateral-emitter field emission devices is the significant design flexibility provided by an integrated structure which reduces the number of interconnections between devices, thus reducing costs and increasing device reliability and performance. Another important object of the invention is a process using existing microelectronic fabrication techniques and apparatus for making integrated lateral laminar-composite-emitter field emission devices with economical yield and with precise control and reproducibility of device dimensions and alignments. More specifically, another object of the invention is a combination of a plurality of materials having differing etch rates in a laminar structure specially adapted to be formed into an improved lateral emitter by an improved fabrication process, and a fabrication process specially adapted to produce such laminar composite lateral emission cathodes. These and other objects and advantages will be apparent from the following description of the invention and various embodiments thereof.

SUMMARY OF THE INVENTION

A novel lateral-emitter electron field emission device structure disclosed herein incorporates a thin film laminar composite emitter structure including two or more films composed of materials having different etch rates when etched by at least one etchant. In its simplest form, the laminar composite emitter consists of two ultra-thin layers, etched so that one of the two layers protrudes in a small-radius tip. In its most preferred form, it is a layered structure composite emitter, of which the most etch-resistant layer is doped-diamond. The diamond layer is doped using one or more N-type dopants. In this structure, the edge of the thin film diamond layer is the dominant electron emitter with a very low (nearly zero) work function. Hence the new device can operate at applied voltages substantially lower than in prior art. The laminar structure may be a sandwich structure with three layers. Upper and/or lower supporting metallic layers act as both physical supporting material and as an integral electrical conducting medium. This allows the diamond layer to be very thin, on the order of tens of angstroms (i.e. less than 100 angstroms). In a preferred process for fabrication of the device, an emitting edge of the laminar composite emitter is first formed by a trench etch. During or after fabrication of the trench portion of the structure, a small amount of the supporting upper and/or lower metallic layers is removed, for example by etching in a plasma etch process. A differential etch process is chosen such that one of the layers of the laminar emitter is less effected, and preferably minimally affected or unaffected by the etch. This leaves an ultra thin emitter edge or tip. In the most preferred structure, the more etch-resistant layer is an N-doped diamond layer, which has a nearly zero work function. For some combinations of materials in the laminar composite emitter structure, a preferred differential etch process may be a chemical or electro-chemical etch, differential electropolishing, or differential ablation.

FIGS. **5*a* and 5*b*** together show schematically a flow diagram illustrating a preferred embodiment of a fabrication process performed in accordance with the invention.

Figure 5A:
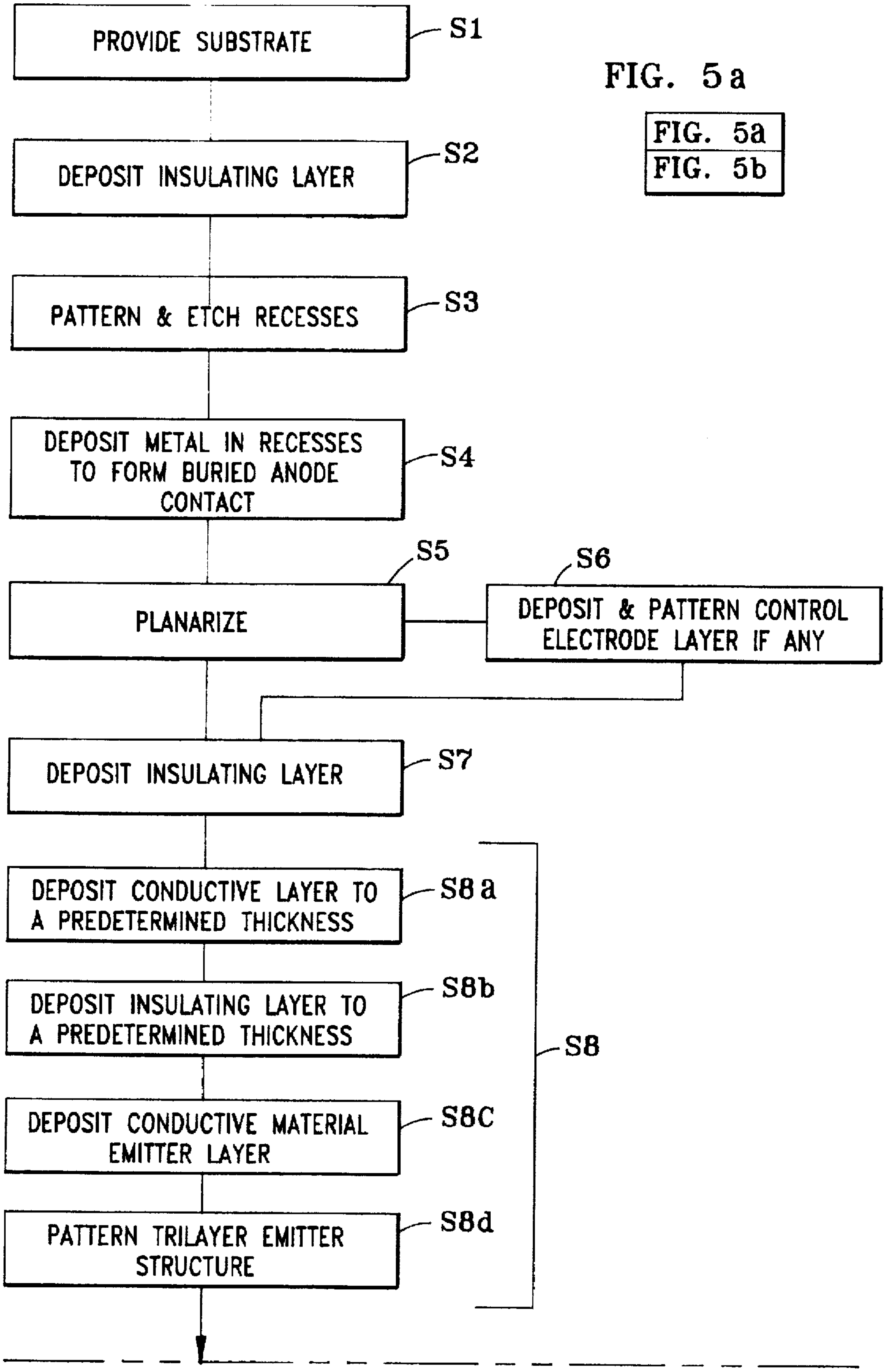
Figure 5B:
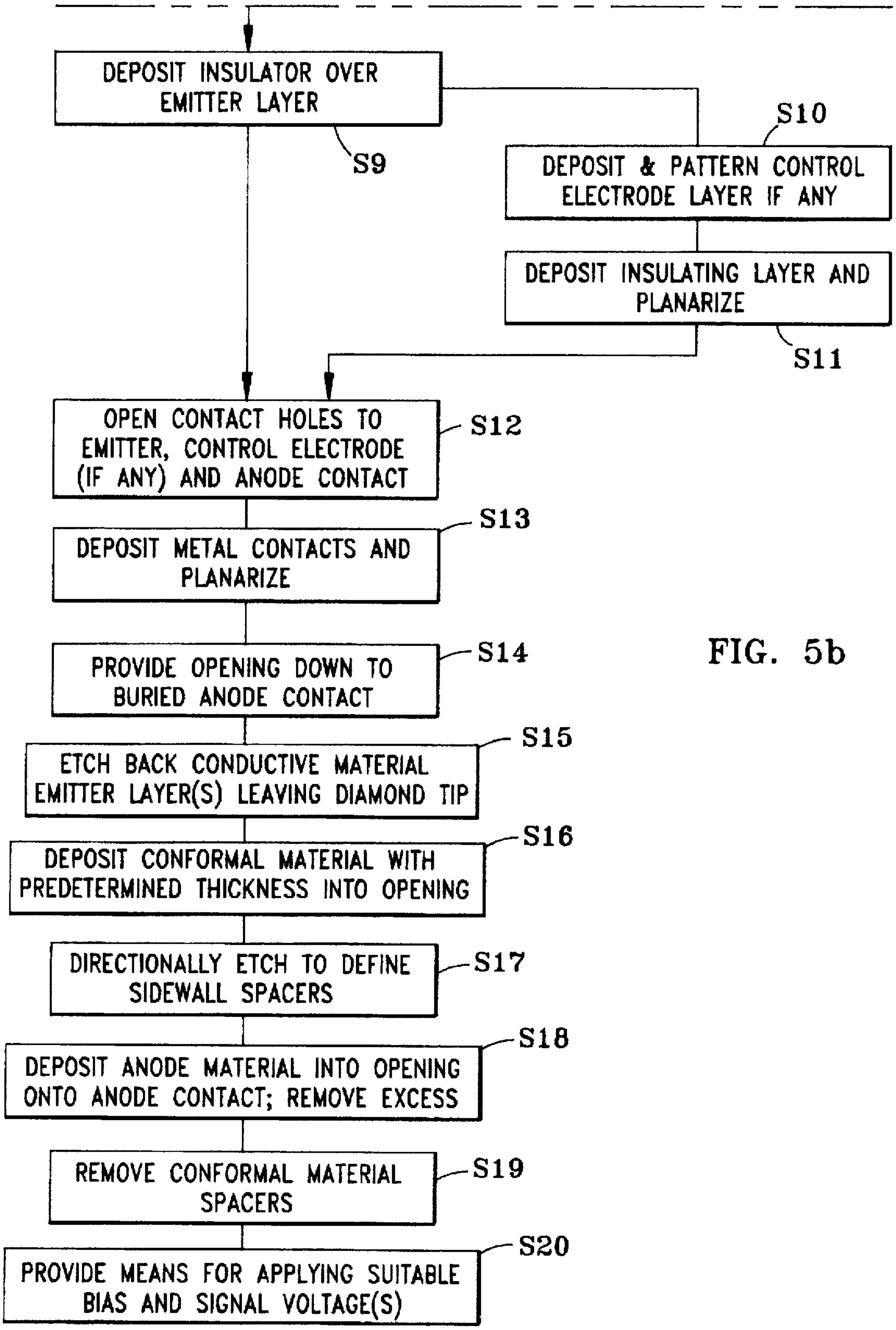
Figure 6A:
Figure 6B:
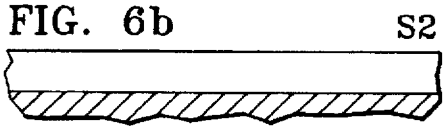
Figure 6C:
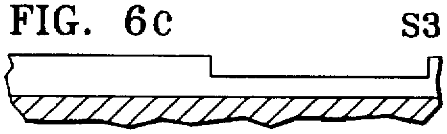
Figure 6D:
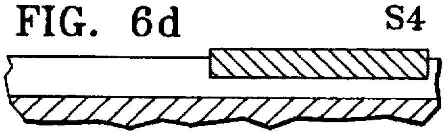
Figure 6E:
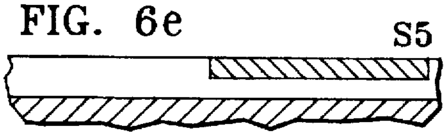
Figure 6F:
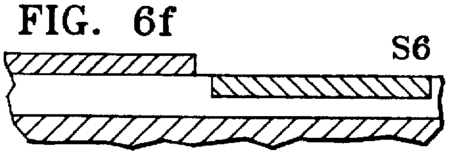
Figure 6G:
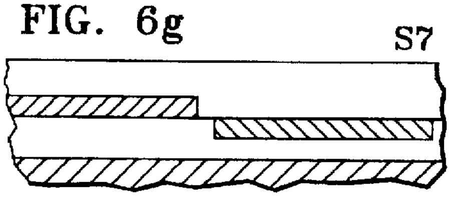
Figure 6H:
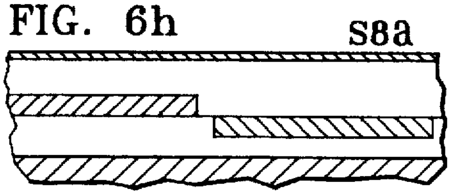
Figure 6I:
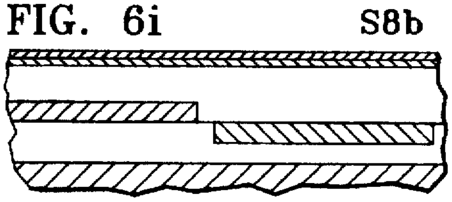
Figure 6J:
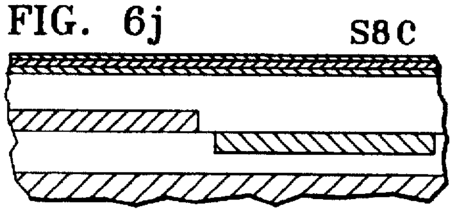
Figure 6K:
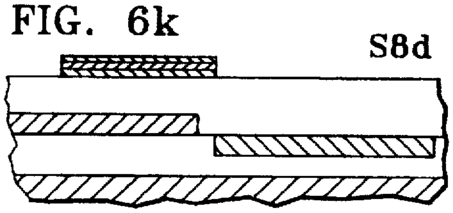
Figure 6L:
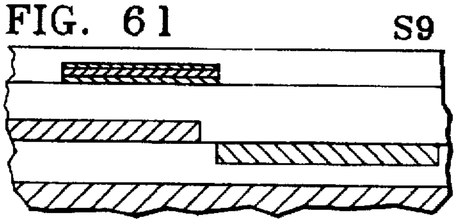
Figure 6M:
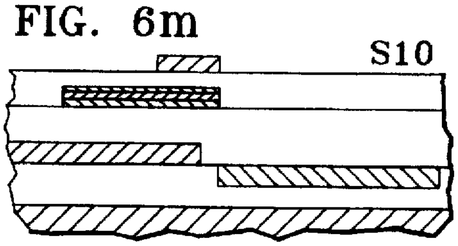
Figure 6N:
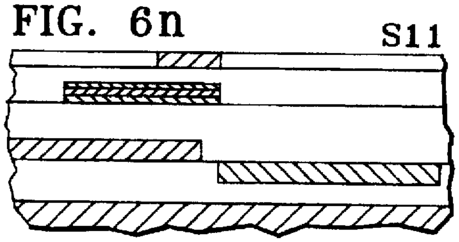
Figure 6O:
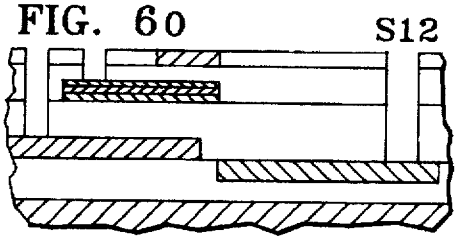
Figure 6P:
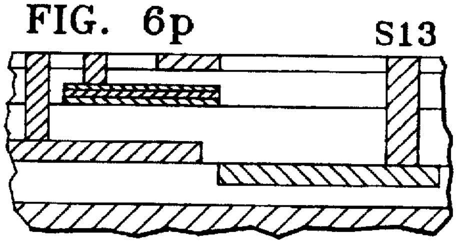
Figure 6Q:
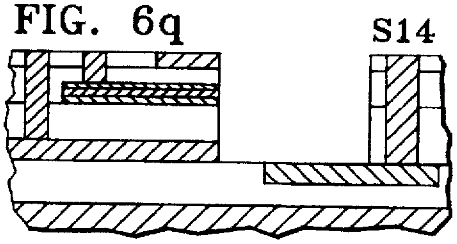
Figure 6R:
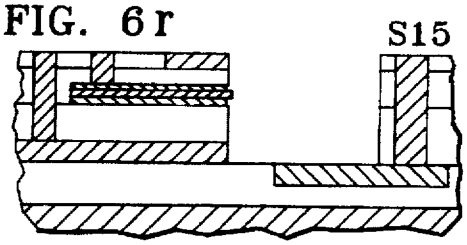
Figure 6S:
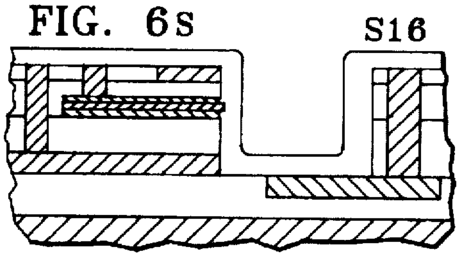
Figure 6T:
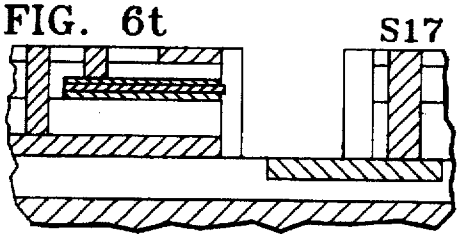
Figure 6U:
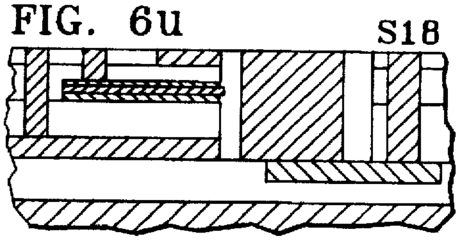
Figure 6V:
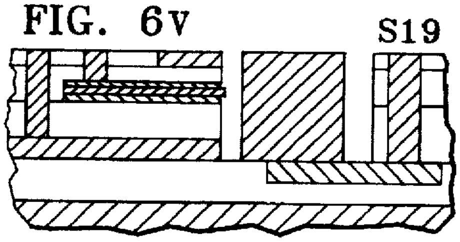
Figure 6W:
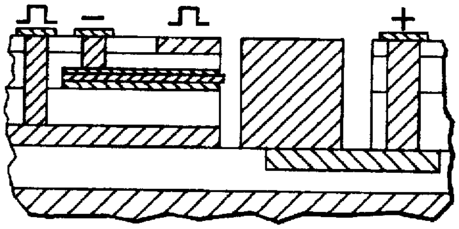

FIGS. **6*a* and 6*w* together show a sequence of cross sectional views of a device at various stages of the fabrication process depicted in FIGS. 5*a* and 5*b***.

DETAILED DESCRIPTION OF THE PREFERRED EMBODIMENTS

Figure 1:
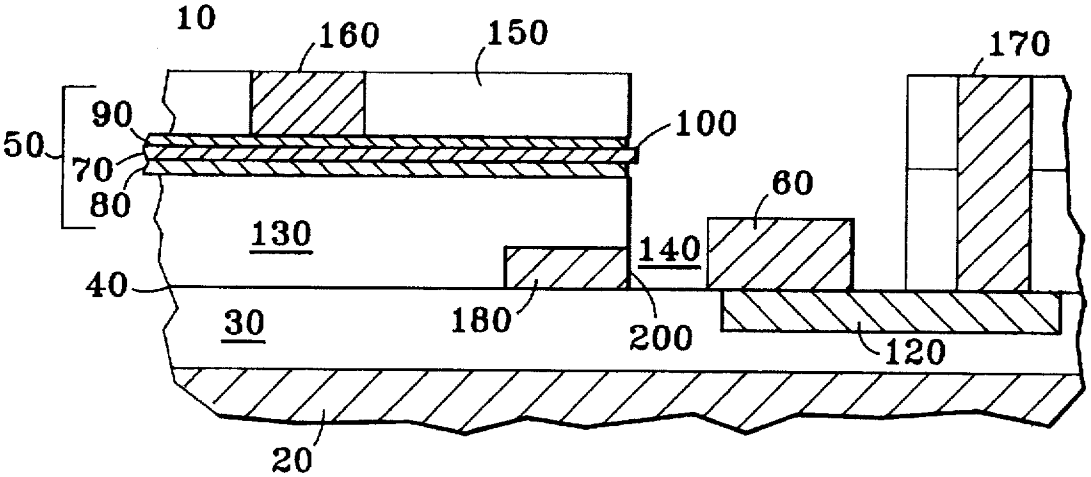
FIG. 1 shows a side elevation view in cross-section of a preferred embodiment of a field emission device made in accordance with the invention.

In the following description of the preferred embodiments, references are made to the drawings in which the same reference numbers are used throughout the various figures to designate the same or similar components. It should be noted that the drawings are not drawn to scale. In particular, the vertical scale of cross-sections is greatly exaggerated for clarity, and thicknesses of various films are not drawn to a uniform scale. FIG. 1 shows a side elevation view in cross-section of a preferred embodiment of a field emission microelectronic device structure made in accordance with the invention, and FIG. 2 shows a plan view of that preferred embodiment of the same device.

Figure 2:
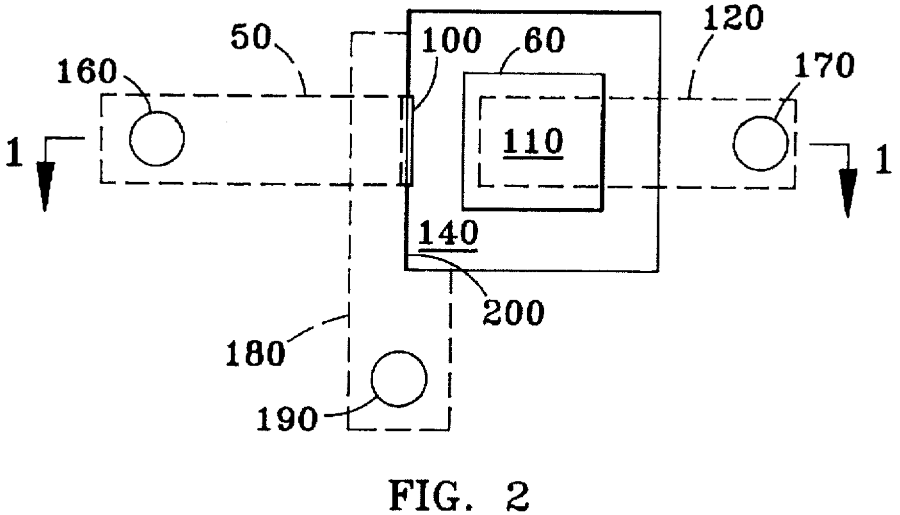
FIG. 2 shows a plan view of the preferred embodiment of a field emission device structure of FIG. 1.
Figure 4:
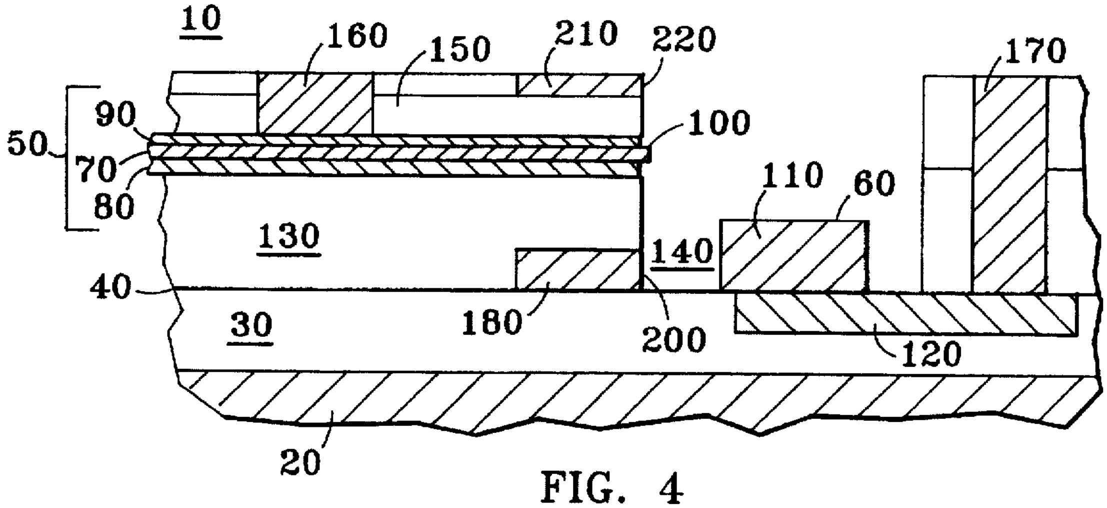
FIG. 4 shows a side elevation view in cross-section of a field emission device structure having more than one control electrode.

As illustrated in FIGS. 1 and 2, the microelectronic field emission device, generally denoted 10, is made on a flat starting substrate 20. A flat silicon wafer is a suitable starting substrate, but the starting substrate may be a flat insulator material such as glass, $Al_2O_3$ (especially in the form of sapphire), silicon nitride, diamond (in insulating, substantially pure, undoped form), etc. For some applications, substrate 20 may be a material known to be transparent. If starting substrate 20 is not an insulator, a film of insulating material 30 such as silicon oxide may be deposited to form an insulating substrate. Alternatively, a conductive substrate may be used as a common anode in some embodiments. If the starting substrate 20 is an insulator, then a separate film of insulating material 30 is not needed, and the top surface of starting substrate 20 is identical to the top surface of insulating material 30. In either case, the top surface of insulating material 30 defines a reference plane 40 from which the positions of other elements of the structure may be referenced or measured. For some applications, insulating material 30 may be a material known to be transparent in suitable film thicknesses described below. The structure also has an emitter 50 and an anode denoted generally by 60. Emitter 50 is a lateral field emission cathode preferably consisting of a trilayer laminar composite, with an ultra-thin diamond layer 70 sandwiched between two layers 80 and 90 of conductive material, placed on a plane parallel to and spaced above reference plane 40. The diamond layer 70 is described in more detail herein below. Emitter 50 has an emitting blade edge or tip 100 of diamond, from which electron current is emitted when the device is operated, as described herein below. For some application, emitter 50 may be formed of materials known to be transparent in suitable film thicknesses described below. Anode 60 may be made entirely of a conductive material such as a metal, or may comprise a layer of phosphor 110 on the top surface of a buried anode contact layer 120, as shown in FIGS. 2 and 4. For some applications, anode 60 may be formed of materials known to be transparent in suitable film thicknesses described below. Buried anode contact layer 120 makes ohmic electrical contact with anode 60, and is preferably made substantially parallel to reference plane 40, with either its upper surface, or its lower surface, or a plane between the two being substantially coplanar with reference plane 40. In the preferred embodiment of FIGS. 1 and 2, buffed anode contact layer 120 is made recessed into insulating surface 30, with its top surface substantially coplanar with reference plane 40. In the preferred process (described in detail below) for forming buried anode contact layer 120, a recess is formed in the insulating surface 30 and the recess is filled with metallization to form anode contact 120. Buried anode contact layer may extend under part of anode 60 as shown in FIG. 1, or under the entire lower side of anode 60 for some purposes (such as acting as a mirror for light emitted from phosphor 110). An insulating layer 130, selectively placed between the plane of buried anode contact layer 120 and the plane of emitter 50, insulates buried anode contact layer 120 from the electron emitter 50.

Lateral laminar composite emitter 50 has an emitting blade edge or tip 100 from which electrons are emitted by field emission when the device structure is operated with appropriate electrical bias voltage (anode positive). The ultra-thin diamond layer 70 comprising the center layer of the laminar composite structure is doped with one or more impurities characterized as N-type dopants for diamond. Examples of such N-type dopants are nitrogen, phosphorus, and arsenic. The dopant quantities used are sufficient to ensure that the work function for electron emission from the diamond surface is less than about 3 electron volts and preferably less than about 1 electron volt. It should be noted that the device is operable with a layer 70 comprising an ultra-thin film of carbon in crystalline form other than diamond (such as graphite for example), or even amorphous forms of carbon, but with diminished performance because the work function for electron emission of such films is typically higher than the N-doped diamond used in the preferred embodiment described here. Conductive outer layers 80 and 90 of the trilayer laminar composite of emitter 50 are preferably made of metals that form ohmic contact with diamond. Tungsten, titanium, and alloys of tungsten and titanium are especially preferred for conductive layers 80 and 90 because of their tendency to form good ohmic contact with diamond and because of their compatibility with the preferred process methods described herein below. Conductive layers 80 and 90 may have thicknesses of about 100 angstroms. Conductive layers 80 and 90 thus provide not only electrical contact, but also mechanical support and protection for the diamond film 70, which can thus be an ultra-thin film. The thickness of diamond layer 70 is preferably tens of angstroms, producing a radius of curvature of emitter tip or blade edge 100 of tens of angstroms. This minute radius of curvature, in combination with the extremely low or nearly zero work function for electron emission of the diamond, allows operation of the device of this invention at very low bias voltages. However, it should also be noted that the device is operable even with omission of either one of conductive layers 80 and 90. It is desirable to have at least one of these layers 80 or 90 present and co-extensive with diamond emitter layer 70 to provide electrical contact to the doped diamond emitter layer 70. However, with sufficient doping concentration in the diamond layer to provide the requisite conductivity within layer 70 itself, layer 80 or layer 90 or both may be made to cover only a portion of diamond emitter layer 70, in order to provide ohmic contact for applying electrical bias voltage to the emitter.

While the preferred embodiment of FIGS. 1 and 2 has a diamond layer, other embodiments of laminar composite emitter 50 include two-layer, three-layer, and multiple-layer laminar composite emitter structures having more than one material but no diamond layer. For example a three-layer laminar composite with an ultra-thin aluminum center layer 70 and tungsten, tantalum, or molybdenum top and bottom layers 80 and 90, may be etched with sulfur hexafluoride ($SF_6$) plasma, which etching leaves a thin sharp emitting blade edge or tip 100 of aluminum. The description of the preferred embodiment continues with reference to a diamond layer 70.

Anode 60 is spaced apart laterally from the blade edge or tip 100 of electron emitter by a predetermined lateral distance and extends upward from buried anode contact layer 120. The height of anode 60 may be such that the top surface of anode 60 is at the top surface of the completed device as shown in FIG. 1, or may be such that anode 60 extends to a height less than the distance between reference plane 40 and emitter 50. This latter height places the top surface of anode 60 below the plane of lateral emitter 50. When the device structure is used in its display function, anode 60 also comprises a phosphor layer 110, as shown in FIGS. 2 and 4, and it is the top surface of phosphor layer 110 that is preferably positioned below the plane of emitter 50. Anode 60 may consist of a metal anode with a relatively thin film of phosphor for phosphor layer 110.

The predetermined gap distance between emitter edge or tip 100 and anode 60 is determined by the width of space 140 shown in FIGS. 1, 2 and 4 (which space is determined in a preferred fabrication process by the thickness of a sacrificial layer of conformal material). The space within space 140 between the cathode and anode as well as the space above anode 60 can comprise a vacuum or can contain a gas. A process for making a structure that encloses space 140 is described herein below. An insulating layer 150 covers at least a portion of lateral emitter 50. For some applications, insulating layer 150 may be formed of materials known to be transparent in suitable film thicknesses.

Figure 3:
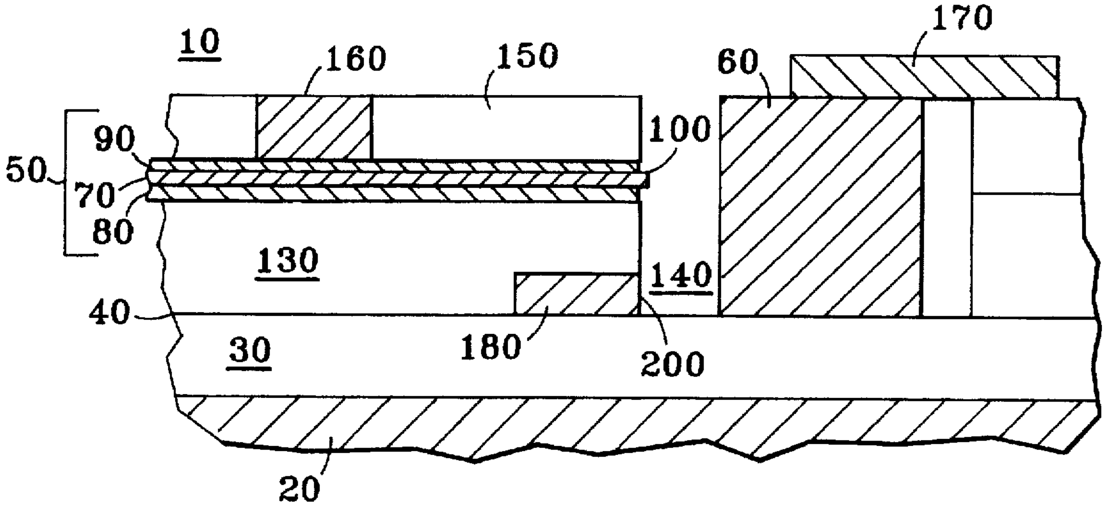
FIG. 3 shows a side elevation view in cross-section of an alternate embodiment of a field emission device.

Electrical contacts are made to lateral emitter 50 by emitter contact 160, and to anode 60 by anode contact 170, respectively. The embodiment shown in FIGS. 1 and 2, with a buried anode contact layer 120, is a preferred structure for applications of the device to displays. However an alternative embodiment (shown in FIG. 3), especially useful for non-display applications, has an anode contact 170 at the top surface of anode 60 and may also omit buried anode contact layer 120. Other embodiments may use both buried and top-surface contacts. For some applications, emitter contact 160 and anode contact 170 may be formed of materials known to be transparent in suitable film thicknesses. It should be noted that the alternative embodiment illustrated in FIG. 3 omits phosphor layer 110, which is not needed for an application of the device where the device is not required to emit light. These "non-display" applications may include applications of a particular individual device within a overall display array apparatus. Such applications include, for example, those wherein the particular individual device is used to switch other devices.

The device may have a control electrode 180, preferably made parallel to (and may be made directly on) reference plane 40 as shown in the embodiment of FIG. 1. Electrical contact is made to it by control electrode contact 190 shown in FIG. 2. Control electrode contact 190 is not shown in FIG. 1, since control electrode 180 extends orthogonally to the plane of FIG. 1 in the embodiment shown. Control electrode 180 has a control electrode edge 200 facing toward anode 60. As shown in the plan view of FIG. 2, and described in more detail herein below in connection with a preferred fabrication process, control electrode edge 200 is automatically aligned with emitter tip or blade edge 100 by the etching of space 140. In operation of the device, a suitable electrical control signal applied to control electrode 180 through control electrode contact 190 can control the electron emission current from emitter 50 to anode 60, thus operating the device as a triode. If control electrode 180 is omitted from the device structure, and/or no control signal is applied to control electrode 180, device 10 operates as a diode.

FIG. 4 shows an alternative embodiment of the device, having a second control electrode 210 made in a plane spaced from the plane of lateral emitter 50, and insulated from the emitter by insulating layer 150. Second control electrode 210 has a control electrode edge 220 facing anode 60. Control electrode edge 220 is automatically aligned vertically with emitter blade edge or tip 100 in the same manner as control electrode edge 200. For some applications, control electrodes 180 and 210 may be formed of materials known to be transparent in suitable film thicknesses.

FIGS. *5a* and *5b* together show schematically a flow diagram illustrating a preferred embodiment of a fabrication process performed in accordance with the invention, with step numbers indicated by references S1, etc. FIGS. *6a–6w* together show a sequence of cross sectional views of a display cell at various stages of the fabrication process depicted in FIGS. *5a* and *5b*. Each cross section of FIGS. *6a–6w* shows the result of the process step indicated next to the cross section. (The identities and functions of individual elements in the cross sections of FIGS. *6a–6w* will be apparent by comparison with corresponding elements in FIG. 1) The detailed process illustrated is a process for a triode (or tetrode) device with two control electrodes. It will be apparent to those skilled in this art that analogous processes may be practiced to fabricate triodes with one control electrode, or to fabricate diodes with no control electrode, by omitting appropriate steps of the process illustrated in the drawing and described herein. An overall outline of a fabrication process for a simple diode device structure is described first, referring to corresponding process steps (indicated by reference numbers S1, etc.) of the more detailed process, followed by a detailed description of the process for more complex devices. In the following fabrication process description, reference numerals of structural elements refer to the corresponding elements in FIGS. 1–4. For clarity, in order to consider a specific example, the process steps are generally described with reference to fabrication of a preferred structure having doped diamond included in the laminar composite emitter.

An overall method of fabricating a field emission device generally comprises the following steps: providing a substrate (step S1); depositing an insulating layer of predetermined thickness (step S7); depositing and patterning a laminar composite emitter layer having a more etch resistant layer (for example of doped diamond) having a thickness of only tens of angstroms between outer layers of conductive material (step S8 comprising substeps S8*a*–S8*d*) so as to extend parallel to the upper surface of the substrate to form an emitter structure; providing an opening (step S14) through the insulating layer and through the emitter layer, thereby forming an emitter blade edge or tip; etching (step S15) the conductive outer layers of the emitter laminar structure back a few angstroms from the tip; depositing a conformal layer of material only on the walls of the opening provided in step S14 to a predetermined thickness to make a spacer (steps S16 and S17); filling the opening at least partially with an anode material layer (step S18) such that the conformal layer spaces the anode material from the edge of the first metallic layer, where the predetermined conformal layer thickness equals a desired spatial distance between the emitter edge of the emitter layer and the anode material; and providing (in steps S12, S13 and S20) means for applying an electrical bias voltage to the emitter layer and to the anode layer, sufficient to cause cold cathode emission current of electrons from the emitter edge to the anode. For a display device, at least a phosphor anode material is deposited in step S18, and the phosphor layer is preferably made of a thickness less that the predetermined thickness of the insulating layer deposited in step S7.

In an alternative process to fabricate a device with a simpler bilayer laminar composite emitter structure, having a diamond layer 70 but only one conductive layer 80 or 90, either substep S8*a* or substep S8*c* is omitted. Depending on whether step S8*a* or step S8*c* is omitted, the emitter will have a conductive layer either over or under diamond layer 70.

To fabricate a triode or tetrode device with two control electrodes, the full process illustrated in FIGS. *5a*, *5b*, *6a–6w* is performed. A substrate 20 is provided (step S1), which may be a silicon wafer. An insulating layer 30 is deposited (step S2) on the substrate. This may be done, for example, by growing a film of silicon oxide approximately one micrometer thick on a silicon substrate. A pattern is defined on the insulator surface for depositing a conductive material. In the preferred process, a pattern of recesses is defined and etched (step S3) into the surface of the insulator layer. In step S4, metal is deposited in the recesses to form a buried anode contact 120, which is then planarized (step S5). While this is described here as a metal deposition, the conductive material deposited in step S4 may be a metal such as aluminum, tungsten, titanium, etc., or may be a transparent conductor such as tin oxide, indium tin oxide etc. For applications using a common anode for all devices made on a substrate, the substrate may be conductive and perform the function of a buried anode contact. For such applications, steps S3, S4, and S5 may be omitted, although step S2 may be required to insulate a control electrode if any.) If a control electrode 180 is to be incorporated into the device structure, a conductive material is deposited and patterned (step S6) on the planarized insulator surface, spaced from the buffed anode contact material deposited in step S4. (The control electrode 180 may be deposited in a recess pattern and planarized, as in the case of the buffed anode contact layer 120.) Another insulator layer 130 is deposited (step S7). This may be a chemical vapor deposition of silicon oxide to a thickness of about 0.05 to 2 micrometers, for example.

In the next four substeps (S8*a*–S8*d*), generally denoted by step S8, the laminar composite emitter structure 50 is formed and patterned. A layer of conductive material is deposited (step S8*a*) to a thickness of about 100 angstroms to form conductive layer 80. If the emitter tip is to be diamond, the best materials for conductive layers 80 and 90 are those metallic elements that tend to easily form carbide compounds. Preferred materials for conductive layers 80 and 90 are titanium, tungsten, tantalum, molybdenum, or their alloys such as titanium-tungsten alloy. However many other conductors may be used, such as aluminum, gold, silver, copper, copper-doped aluminum, platinum, palladium, polycrystalline silicon, etc. or transparent thin film conductors such as tin oxide or indium tin oxide (ITO).

In step S8*b*, diamond is deposited, for example by chemical vapor deposition to form the inner core layer 70 of emitter 50. The diamond layer deposition in step S8*b* is controlled to form a film preferably of about 20–50 angstroms thickness in order to have an emitter blade edge or tip in the final structure that has a radius of curvature preferably less than 30 angstroms and more preferably less than 20 angstroms. At least one N-type dopant, such as nitrogen, phosphorus, or arsenic, is introduced during deposition to dope the deposited diamond film to an effective concentration, preferably between zero and $10^{18}$ dopant atoms/cm$^3$, in the diamond film to produce a desired low work function. The most important factor in choosing the dopant concentration is its effect in producing a desired low work function for emission of electrons from the diamond emitting edge, preferably below about 3 electron volts. A representative suitable doping level is provided by phosphorus (from $P_2O_5$ for example) to a final dopant concentration in the diamond film of about $10^{15}$ phosphorus atoms/cm$^3$. Another layer of conductive material, preferably the same material as conductive layer 80, is deposited (step S8*c*) over the diamond layer 70 to a thickness of about 100 angstroms to form conductive layer 90, and to form the trilayer laminar composite structure consisting of layers 80, 70, and 90, to have a total thickness of about 200 to 250 angstroms. In step S8*d*, the trilayer laminar composite structure consisting of layers 80, 70 and 90 is patterned to complete the formation of emitter layer 50. It will be apparent to those skilled in the art that for other combinations of materials in the thin films of a laminar composite emitter, the details of steps S8*a*–S8*d* will be varied to suit the specific materials employed. For example, in the case of a laminar composite emitter consisting of two layers, of tantalum and aluminum respectively, step S8*a* (or S8*c*) is omitted, a thin film of aluminum is deposited in step S8*b*, and a film of tantalum is deposited in step S8*c* (or S8*a* if step S8*c* is omitted).

This description of a fabrication process continues from this point with reference to FIG. 5*b* and FIGS. 6*l*–6*w*, respectively showing the remaining fabrication steps and the corresponding side cross sectional views of the device. An insulator 150 is deposited (step S9) over the emitter layer. Again this may be a chemical vapor deposition of silicon oxide to a thickness of about 0.05 to 2 micrometers, for example. If there are to be two control electrodes and symmetry with respect to the plane of emitter layer 50 is desired, then insulator layer 150 should be made the same thickness as insulator layer 130. If a second control electrode 210 is to be incorporated, a conductive material is deposited and patterned (step S10) to form the control electrode layer 210, and an insulating layer if desired is deposited and optionally planarized (step S11). (The control electrode 210 may be deposited in a recess pattern and planarized, as in the case of the buried anode contact layer 120.)

In step S12, contact holes are opened from the upper surface through insulator layer(s) to the emitter layer 50, to one or two control electrode layers 180 and/or 210 if any, and to the buried anode contact layer 120. These contact holes are filled with conductive material by conventional processes in step S13, to form conductive contact studs 160, 170 and 190 extending upward to the top surface. In step S14, an opening is provided to the buried anode contact layer 120. This opening is patterned to define space for anode 60 and space 140, and the pattern is made to intersect at least some portions of emitter layer 50 (and of control electrode layers 180 and/or 210 if any), to define emitting edge 100 of emitter layer 50 (and to define edge 200 of first control electrode layer 180 if any, and the corresponding edge 220 of second control electrode layer 210 if any). This step is performed by using conventional directional etching processes such as reactive ion etching sometimes called "trench etching" in the semiconductor fabrication literature. In step S15, conductive material layers 80 and 90 are further etched back by a few angstroms from emitter blade or tip edge 100, using a plasma etch that etches the conductive layers 80 and 90, but does not etch diamond appreciably. This differential etching leaves a small salient portion of emitter central layer 70 (extending beyond the remaining edges of the other films 80 and 90). This salient portion forms the extremely fine diamond emitting blade or tip 100 of lateral emitter 50. The etch processes used in steps S14 and S15 may be combined in a compound process step, such as a directional reactive ion etch with a particular gas at a particular pressure to form the trench, followed by a plasma etch with the same or different gas and/or a different pressure to etch layers 80 and 90 while the device remains in the same etch apparatus.

In step S16, a conformal layer of material is deposited with predetermined thickness. This material could be any of several conformal materials such as parylene. In step S17, a directional etch is performed to remove the conformal layer everywhere except on the sidewalls of the opening provided in step S14. This provides a spacer of predetermined thickness on the sidewalls of that opening. Preferred spacer thickness is in the range 0.1 to 0.4 micrometer. The best spacer dimension depends on a number of variables, such as the emitter work function, the emitter edge radius of curvature, and the operating bias voltage range desired. That spacer will define the predetermined gap width separating the field emitter blade edge or tip 100 from anode 60 in the completed field emission device structure. In step S18, an anode material 60 is deposited into the opening onto buried anode contact layer 120, and any excess anode material not in the opening is removed (by chemical-mechanical polishing, for example). For a display device, a phosphor anode material is deposited in step S18, and the phosphor layer is preferably made of a thickness less that the predetermined thickness of the insulating layer deposited in step S7. Suitable phosphors include zinc oxide (ZnO), zinc sulfide (ZnS) and other compounds, where activators are indicated herein after a colon following the primary phosphor host material, viz.: ZnO:Zn; $SnO_2$:Eu; $ZnGa_2O_4$:Mn; $La_2O_2S$:Tb; $Y_2O_2S$:Eu; LaOBr:Tb; ZnS:Zn+$In_2O_3$; ZnS:Cu, Al+$In_2O_3$; (ZnCd)S:Ag+$In_2O_3$; and ZnS:Mn+$In_2O_3$. In this list of phosphors, the plus sign (+) denotes a composition containing more than one activator. Other suitable phosphor materials are described for example in the chapter by Takashi Hase et al. "Phosphor Materials for Cathode Kay Tubes" in "Advances in Electronics and Electron Physics" Vol. 79 (Academic Press, San Diego, Calif., 1990), pages 271–373, which reference also uses the conventional phosphor notation used here.

In step S19, the conformal layer material is removed, by a conventional plasma etch step, leaving the previously mentioned predetermined gap in space 140 between emitter edge 100 and anode 60. In step S20, means are provided for applying suitable electrical bias voltages, and (for devices incorporating control electrodes) suitable signal voltages. Such means may include, for example, contact pads selectively provided at the device top surface to make electrical contact with contacts 160, 170, and 190, and optionally may include wire bonds, means for tape automated bonding, flip-chip or C4 bonding, etc. In use of the device, of course, conventional power supplies and signal sources must be provided to supply the appropriate bias voltages and control signals. These will include providing sufficient voltage amplitude of the correct polarity (anode positive) to cause cold-cathode field emission of electron current from emitter edge 100 to anode 60 and anode buried contact 120. If desired, a passivation layer may be applied to the device top surface, except where there are conductive contact studs and/or contact pads needed to make electrical contacts. It will be apparent that for some display applications, for example, all the elements of the device may be formed of materials known to be transparent in suitable film thicknesses. This completes the description of the detailed process illustrated in FIGS. 5*a*, 5*b*, 6*a*–6*w*.

If it is desired to have the field emission cell operating with a vacuum or a low pressure inert gas in space 140, it is necessary to enclose that space or cavity. This can be done by a process similar to that described in the anonymous publication "Ionizable Gas Device Compatible with Integrated Circuit Device Size and Processing," publication 30510 in "Research Disclosure", Number 305, September 1989. Such a process can be begun by etching a small auxiliary opening, connected to the opening provided in step S14. This auxiliary opening may be made at a portion of the cavity spaced away from the emitter edge area. The opening for the main cavity and the connected auxiliary opening are both filled temporarily with a sacrificial organic material, such as parylene, and then planarized. An inorganic insulator is deposited, extending over the entire device surface including over the sacrificial material, to enclose the cavity. A hole is made in the inorganic insulator by reactive ion etching only over the auxiliary opening. The sacrificial organic material is removed from within the cavity by a plasma etch, such as an oxygen plasma etch, which operates through the hole. The atmosphere surrounding the device is then removed to evacuate the cavity. If an inert gas filler is desired, then that gas is introduced at the desired pressure. Then the hole and auxiliary opening are immediately filled by sputter-depositing an inorganic insulator to plug the hole. If introduction of a gettering material is desired, the hole-plugging step may consist of two or more substeps: viz. depositing a quantity of getter material, and then depositing an inorganic insulator to complete the plug. The plug of inorganic insulator seals the cavity and retains either the vacuum or any inert gas introduced. The gettering material, if used, is chosen to getter any undesired gases, such as oxygen or gases containing sulfur, for example. Some suitable getter materials are Ca, Ba, Ti, alloys of Th, etc. or other conventional getter materials known in the art of vacuum tube construction. This process for retaining vacuum or gas atmospheres is not illustrated in FIGS. 5*a*, 5*b*, 6*a*–6*w*.

It will be appreciated by those skilled in the art that integrated arrays of field emission devices may be made by simultaneously performing each step of the fabrication process described herein for a multiplicity of field emission devices on the same substrate, while providing various interconnections among them. An integrated array of field emission devices made in accordance with the present invention has each device made as described herein, and the devices are arranged as cells containing at least one emitter and at least one anode per cell. The cells are arranged along rows and columns, with the anodes interconnected along the columns for example, and the emitters interconnected along the rows.

There are many diverse uses for the field emission device structure and fabrication process of this invention, especially in making flat panel displays for displaying images and for displaying character or graphic information with high resolution. It is expected that the type of flat panel display made with the device of this invention can replace many existing displays including liquid crystal displays, because of their lower manufacturing complexity and cost, lower power consumption, higher brightness, and improved range of viewing angles. Displays made in accordance with the present invention are also expected to be used in new applications such as displays for virtual reality systems. In embodiments using substantially transparent substrates and films, displays incorporating the structures of the present invention are especially useful for augmented-reality displays.

Other embodiments of the invention to adapt it for various uses and conditions will be apparent to those skilled in the art from a consideration of this specification or from practice of the invention disclosed herein. For one example, additional electrodes such as screen electrodes may be incorporated into the structures disclosed to perform functions analogous to screen grids and other kinds of electrodes such as those used in tetrodes, pentodes, etc. known in vacuum tube art. For another example, the upper surface of the phosphor and/or anode may be made non-planar to shape the electric field and/or to optimize uniformity of the phosphor's light emission. Also, the order of the various fabrication process steps may be varied for some purposes, and some process steps may be omitted for fabrication of the simpler structures. It is intended that the specification and examples be considered as exemplary only, with the true scope and spirit of the invention being defined by the following claims.

Having described my invention, I claim:

1. A microelectronic device of the type using a cold-cathode field-emission electron source, comprising:

a) a substrate having a substrate upper surface defining a first plane;

b) an anode;

c) a composite lateral field-emission electron emitter spaced apart from said anode by a first predetermined distance and disposed on a second plane parallel to said first plane, said composite lateral field-emission electron emitter comprising:

i) a first conductive film having an upper major surface disposed substantially parallel to said second plane, and ii) a second conductive film disposed in contact with said upper major surface of said first conductive film, one of said first and second conductive films comprising a carbon film, said first and second conductive films being characterized by having differing etch rates to an etchant, whereby one of said first and second conductive films may be differentially etched from a portion of the other to remove at least an edge portion of said one of said first and second conductive films, while leaving at least a salient edge portion of the other to form an emitting tip;

d) a first conductive contact connected to said first conductive film of said electron emitter to provide a cathode contact;

e) a second conductive contact spaced apart from said first conductive contact and connected to said anode to provide an anode contact, whereby said device may have an electrical bias voltage applied; and f) means for applying said electrical bias voltage.

2. A microelectronic device as recited in claim 1, wherein said one of said first and second conductive films comprises a diamond film containing a quantity of a material characterized as an N-type dopant for diamond, said quantity being sufficient to produce a work function for electron emission of less than 3 electron volts.

3. A microelectronic device of the type using a cold-cathode field-emission electron source, comprising:

a) a substrate having a substrate upper surface defining a first plane;

b) an anode;

c) a field-emission electron emitter spaced apart from said anode by a first predetermined distance and disposed on a second plane parallel to said first plane, said electron emitter comprising:

i) a thin carbon film having upper and lower major surfaces disposed substantially parallel to said second plane, ii) a first conductive film disposed in contact with said upper major surface of said carbon film, and iii) a second conductive film disposed in contact with said lower major surface of said carbon film;

d) a first conductive contact connected to at least one of said first and second conductive films of said electron emitter to provide a cathode contact;

e) a second conductive contact spaced apart from said first conductive contact and connected to said anode to provide an anode contact, whereby said device may have an electrical bias voltage applied; and f) means for applying said electrical bias voltage.

4. A microelectronic device as recited in claim 3, wherein said thin carbon film further comprises a diamond film.

5. A microelectronic device as recited in claim 4, wherein said diamond film further comprises chemical-vapor-deposited diamond.

6. A microelectronic device as recited in claim 4, wherein said diamond film further comprises diamond containing a predetermined quantity of a material characterized as an N-type dopant for diamond.

7. A microelectronic device as recited in claim 6, wherein said predetermined quantity of material is sufficient to produce a work function of less than 3 electron volts.

8. A microelectronic device as recited in claim 6, wherein said N-type dopant is selected from the list consisting of nitrogen, phosphorus, and arsenic.

9. A microelectronic device as recited in claim 8, wherein said predetermined quantity of N-type dopant is sufficient to produce a work function of less than 3 electron volts.

10. A microelectronic device as recited in claim 3, further comprising:

g) a conductive control electrode spaced apart from said anode by a second predetermined distance and disposed in a third plane spaced from said second plane;

h) an insulating layer selectively disposed between said second and third planes to insulate said control electrode from said electron emitter;

j) a third conductive contact spaced apart from said first and second conductive contacts and connected to said control electrode, whereby an electrical control signal may be applied to said device; and k) means for applying said electrical control signal.

11. A microelectronic device as recited in claim 10, wherein said thin carbon film further comprises a diamond film.

12. A microelectronic device as recited in claim 11, wherein said diamond film further comprises chemical-vapor-deposited diamond.

13. A micro electronic device as recited in claim 11, wherein said diamond film further comprises diamond containing a predetermined quantity of a material characterized as an N-type dopant for diamond.

14. A microelectronic device as recited in claim 13, wherein said N-type dopant is selected from the list consisting of nitrogen, phosphorus, and arsenic.

15. A microelectronic device as recited in claim 10, wherein said first predetermined distance and said second predetermined distance are substantially equal, whereby said electron emitter and said control electrode are aligned each with the other.

16. A microelectronic device as recited in claim 3, further comprising:

g) a first control electrode spaced apart from said anode by a second predetermined distance and disposed in a third plane spaced from said second plane;

h) an insulating layer selectively disposed between said second and third planes to insulate said first control electrode from said electron emitter;

j) a third conductive contact spaced apart from said first and second conductive contacts and connected to said first control electrode, whereby a first electrical control signal may be applied to said device;

k) a second control electrode spaced apart from said anode by a third predetermined distance and disposed in a fourth plane spaced from said second plane;

l) an insulating layer selectively disposed between said second and fourth planes to insulate said second control electrode from said electron emitter;

m) a fourth conductive contact spaced apart from said first, second, and third conductive contacts and connected to said second control electrode, whereby a second electrical control signal may be applied to said device; and n) means for applying said first and second electrical control signals.

17. A microelectronic device as recited in claim 3, further comprising:

g) a plurality of control electrodes, each one of said control electrodes being insulated from said electron emitter and from said anode, and each one of said control electrodes being connected to a conductive control contact spaced apart from said first and second conductive contacts; and h) means for applying electrical control signals to each of said conductive control contacts.

18. A microelectronic device of the type using a cold-cathode field-emission electron source, comprising:

a) a substrate having a substrate upper surface defining a first plane;

b) an anode;

c) a field-emission electron emitter spaced apart from said anode by a first predetermined distance and disposed on a second plan, parallel to said first plane, said electron emitter comprising:

i) a thin carbon film having an upper major surface disposed substantially parallel to said second plane, and ii) a first conductive film disposed in contact with said upper major surface of said carbon film;

d) a first conductive contact connected to said first conductive film of said electron emitter to provide a cathode contact;

e) a second conductive contact spaced apart from said first conductive contact and connected to said anode to provide an anode contact, whereby said device may have an electrical bias voltage applied; and f) means for applying said electrical bias voltage.

19. A microelectronic device as recited in claim 18, wherein said thin carbon film comprises a diamond film containing a quantity of a material characterized as an N-type dopant for diamond, said quantity being sufficient to produce a work function for electron emission of less than 3 electron volts.

20. A microelectronic device of the type using a cold-cathode field-emission electron source, comprising:

a) a substrate having a substrate upper surface defining a first plane;

b) an anode;

c) a field-emission electron emitter spaced apart from said anode by a first predetermined distance and disposed on a second plane parallel to said first plane, said electron emitter comprising:

i) a thin carbon film having a lower major surface disposed substantially parallel to said second plane, ii) a first conductive film disposed in contact with said lower major surface of said carbon film;

d) a first conductive contact connected to said first conductive film of said electron emitter to provide a cathode contact;

e) a second conductive contact spaced apart from said first conductive contact and connected to said anode to provide an anode contact, whereby said device may have an electrical bias voltage applied; and f) means for applying said electrical bias voltage.

21. A microelectronic device as recited in claim 20, wherein said thin carbon film comprises a diamond film containing a quantity of a material characterized as an N-type dopant for diamond, said quantity being sufficient to produce a work function for electron emission of less than 3 electron volts.

22. A microelectronic device of the type using a cold-cathode field-emission electron source, comprising:

a) a substrate having a substrate upper surface defining a first plane;

b) an anode;

c) a field-emission electron emitter spaced apart from said anode by a first predetermined distance and disposed on a second plane parallel to said first plane, said electron emitter comprising:

i) a thin carbon film having upper and lower major surfaces disposed substantially parallel to said second plane, said thin carbon film further comprising a diamond film containing a predetermined quantity of a material characterized as an N-type dopant for diamond, ii) a first conductive film disposed in contact with said upper major surface of said carbon film, and iii) a second conductive film disposed in contact with said lower major surface of said carbon film;

d) a first conductive contact connected to at least one of said first and second conductive films of said electron emitter to provide a cathode contact;

e) a second conductive contact spaced apart from said first conductive contact and connected to said anode to provide an anode contact, whereby said device may have an electrical bias voltage applied; and f) means for applying said electrical bias voltage.

23. A microelectronic device of the type using a cold-cathode field-emission electron source, comprising:

a) a substrate having a substrate upper surface defining a first plane;

b) an anode;

c) a field-emission electron emitter spaced apart from said anode by a first predetermined distance and disposed on a second plane parallel to said first plane, said electron emitter comprising:

i) a thin carbon film having upper and lower major surfaces disposed substantially parallel to said second plane, said thin carbon film further comprising a diamond film containing a predetermined quantity of a material characterized as an N-type dopant for diamond, ii) a first conductive film disposed in contact with said upper major surface of said carbon film, and iii) a second conductive film disposed in contact with said lower major surface of said carbon film;

d) a first conductive contact connected to at least one of said first and second conductive films of said electron emitter to provide a cathode contact;

e) a second conductive contact spaced apart from said first conductive contact and connected to said anode to provide an anode contact, whereby said device may have an electrical bias voltage applied;

f) a conductive control electrode spaced apart from said anode by a second predetermined distance and disposed in a third plane spaced from said second plane;

g) an insulating layer selectively disposed between said second and third planes to insulate said control electrode from said electron emitter;

h) a third conductive contact spaced apart from said first and second conductive contacts and connected to said control electrode, whereby an electrical control signal may be applied to said device; and j) means for applying said electrical bias voltage and said electrical control signal.

24. A microelectronic device as recited in claim 3, wherein said anode comprises a phosphor.

25. A microelectronic device as recited in claim 10, wherein said anode comprises a phosphor.

26. A microelectronic device as recited in claim 18, wherein said anode comprises a phosphor.

27. A microelectronic device as recited in claim 20, wherein said anode comprises a phosphor.

28. A microelectronic device as recited in claim 22, wherein said anode comprises a phosphor.

29. A microelectronic device as recited in claim 3, wherein said substrate, anode, emitter, and first and second conductive contacts each comprises a material substantially transparent to light.

30. A microelectronic device as recited in claim 10, wherein said substrate, anode, emitter, insulating layer, control electrode, and first, second, and third conductive contacts each comprises a material substantially transparent to light.

31. A microelectronic device as recited in claim 18, wherein said substrate, anode, carbon film, first conductive film, and first and second conductive contacts each comprises a material substantially transparent to light.

32. A microelectronic device as recited in claim 20, wherein said substrate, anode, carbon film, first conductive film, and first and second conductive contacts each comprises a material substantially transparent to light.

33. A microelectronic device as recited in claim 22, wherein said substrate, anode, carbon film, first conductive film, second conductive film, and first and second conductive contacts each comprises a material substantially transparent to light.

34. A microelectronic device as recited in claim 23, wherein said substrate, anode, carbon film, first conductive film, second conductive film, insulating layer, control electrode, and first, second, and third conductive contacts each comprises a material substantially transparent to light.

35. A microelectronic device of the type having a substrate with a substrate upper surface defining a first plane, an anode, and a lateral cold-cathode field-emission electron source spaced apart from said anode by a first distance and disposed on a second plane parallel to said first plane, said microelectronic device being fabricated by performing the steps of:

a) forming a first insulating layer on said substrate, said first insulating layer having a top major surface;

b) etching a recessed pattern in said top major surface of said first insulating layer;

c) filling said recessed pattern with a conductive material to form a buried conductive layer;

d) polishing said first insulating layer and said conductive material to remove conductive material not in said recessed pattern;

e) depositing a second insulating layer;

f) depositing in sequence
  (i) an emitter bottom layer of a first conductive material,
  (ii) an emitter top layer of a second conductive material to form a laminar composite emitter layer;

g) patterning and etching said laminar composite emitter layer;

h) depositing a third insulating layer;

i) forming contact holes through selected insulating layers and filling said contact holes with a conductive material;

j) if necessary, removing excess conductive material;

k) forming a trench area having trench sidewalls by selectively and directionally etching through previously formed layers, stopping at said buried conductive layer;

l) etching said laminar composite emitter layer to remove at least an edge portion of one of said emitter top and bottom layers, while leaving at least a salient edge portion of the other of said emitter top and bottom layers to form an emitting tip of said cold-cathode field-emission electron source;

m) depositing a conformal layer of sacrificial material on said trench sidewalls and forming upper and lower surfaces of said conformal layer;

n) directionally etching said conformal layer to substantially remove said upper and lower surfaces while leaving a thickness of sacrificial material on said trench sidewalls;

o) depositing anode material in said trench to form said anode; and p) removing said sacrificial material from said trench sidewalls, thus providing a gap to accommodate electron emission from said laminar composite emitter layer to said anode in said field-emission device.

36. A microelectronic device as recited in claim 35, wherein one of said emitter top layer and said emitter bottom layer further comprises a thin layer of carbon having diamond crystal structure.

37. A microelectronic device as recited in claim 36, wherein said one of said emitter top layer and said emitter bottom layer comprises a diamond film containing 0 to $10^{18}$ atoms per cubic centimeter of a material characterized as an N-type dopant for diamond.

38. A microelectronic device as recited in claim 36, wherein said one of said emitter top layer and said emitter bottom layer comprises a diamond film containing a quantity of a material characterized as an N-type dopant for diamond, said quantity being sufficient to produce a work function for electron emission of less than 3 electron volts.

39. An electron emitter for a microelectronic device of the type using a lateral field-emission electron source, said electron emitter being fabricated by performing the steps of:

a) depositing in sequence
  (i) a conductive emitter bottom layer,
  (ii) a thin emitter central layer of carbon having a diamond crystal structure and having a work function for electron emission of less than 3 electron volts, and
  (iii) a conductive emitter top layer to form a sandwich emitter trilayer;

b) patterning said sandwich emitter trilayer;

c) removing a portion of said sandwich emitter trilayer to form an edge; and d) etching said conductive emitter bottom layer and said conductive emitter top layer from said edge, while leaving at least a salient edge portion of said thin emitter center layer to form an emitting edge of diamond.

40. An electron emitter for a microelectronic device of the type using a lateral field-emission electron source, said electron emitter being fabricated by performing the steps of:

a) depositing in sequence
  (i) a conductive emitter bottom layer,
  (ii) a thin emitter central layer of aluminum, and
  (iii) a conductive emitter top layer to form a sandwich emitter trilayer;

b) patterning said sandwich emitter trilayer;

c) removing a portion of said sandwich emitter trilayer to form an edge; and d) etching said conductive emitter bottom layer and said conductive emitter top layer from said edge, while leaving at least a salient edge portion of said thin emitter center layer to form an emitting edge of aluminum.

41. An electron emitter as recited in claim 40, wherein each of said conductive emitter bottom layer and said conductive emitter top layer comprises a metal selected from tungsten, tantalum, and molybdenum.

* * * * *